United States Patent [19]

Schillalies et al.

[11] 3,937,957

[45] Feb. 10, 1976

[54] APPARATUS FOR DETERMINING THE ENERGY OF CHARGED PARTICLES

[75] Inventors: Helmut Schillalies, Rondorf; Alfred Barz, Lohmar, both of Germany

[73] Assignee: Leybold-Heraeus-GmbH & Co., Cologne-Bayental, Germany

[22] Filed: June 18, 1974

[21] Appl. No.: 480,924

[30] Foreign Application Priority Data

June 19, 1973 Germany ............................ 2331091

[52] U.S. Cl. ................................ 250/305; 250/398

[51] Int. Cl.[2] ........................................ H01J 37/26

[58] Field of Search ........... 250/305, 307, 309, 310, 250/396, 397, 398

[56] References Cited

UNITED STATES PATENTS 3,766,381 10/1973 Watson ............................... 250/305

*Primary Examiner*—Craig E. Church

*Attorney, Agent, or Firm*—Spencer & Kaye

[57] ABSTRACT

In a device for measuring the energy of charged particles separated from a sample by bombardment with ionizing radiation, which device includes an energy analyzer and an electron lens system disposed between the sample location and the analyzer and including a charged particle deceleration path, the electron lens system is composed of two individual lenses producing an intermediate image between them, with the deceleration path being located between the two lenses to contain the plane of such intermediate image.

6 Claims, 2 Drawing Figures

APPARATUS FOR DETERMINING THE ENERGY OF CHARGED PARTICLES

BACKGROUND OF THE INVENTION

The present invention relates to an apparatus for determining the energy of charged particles, particularly of electrons separated from a sample by bombardment with ionizing radiation, the apparatus including an evergy analyzer as well as an electron-optical system disposed between the sample and the energy analyzer and containing a deceleration path for the charged particles to be analyzed.

In order to perform electron spectroscopy for chemical analysis (ESCA), it is common practice to bombard the sample to be tested with ionizing radiation. The energy of the electrons thus separated from the surface of the sample is then measured. The recorded energy spectrum of the electrons indicates the chemical composition of the surface of the sample. The energy of the electron leaving the sample can be measured between 2 and 1487 electron volts. When using the AL–Kd radiation for excitation. For other excitation-energys, the margin will have other limits.

German Offenlegungsschrift (Laid-Open Patent Application) No. 1,948,757 discloses a system for decelerating the electrons emanating from the sample directly in the vicinity of the sample and for guiding them through an annular gap to an energy analyzer. The deceleration effects an improvement in the properties, particularly the resolution, of the electronspectrometer disclosed in German Offenlegungsschrift (Laid-Open Patent Application) No. 1,948,757. However, this known electronspectrometer has the drawback that the immediate vicinity of the sample is not free of fields. Thus, it is impossible to perform other experiments simultaneously with the same sample or to perform successive analyses of the sample merely by switching instruments without modifying them.

Furthermore, the distance between the sample and the analyzer is very small. It is therefore difficult to define the aperture opening from outside the analyzer.

It is a further drawback that the particles, which may be electrons, photons, fast neutral particles, or sputter dirt, enter the analyzer with high energy and may there produce stray electrons which then contribute to an increased noise background in the energy spectrum.

SUMMARY OF THE INVENTION

It is therefore an object of the present invention to avoid the above-noted drawbacks in an apparatus for determining the energy of charged particles, particularly electrons separated from a sample by bombardment with ionizing radiation, of the type including an energy analyzer and an electron-optical system disposed between the sample and the energy analyzer, the latter system presenting a deceleration path for the particles to be analyzed.

The advantages realized by retarding the charged particles before their entrance into the analyzer are maintained. Moreover, a relatively compact structure is realized for the electron-optical system disposed between the sample and the energy analyzer.

These and other objects are achieved according to the present invention by constituting the electron-optical system disposed between the sample and the analyzer of two parts acting as individual lenses which are separated by a region constituting a deceleration path in which is formed the intermediate image of the point on the sample from which electrons emanate. The vicinity of the sample can thus be kept free of fields, which permits the sample to additionally be arranged for other, simultaneously performed, experiments.

The first part, or first lens, disposed between the sample and the deceleration path may, for example, be a lens which produces an image enlargement so that, according to the Lionville theorem, the angle of the electron beam envelope will not be widened. The "enlargement" will advantageously be selected so that only the electrons emitted from the sample and not those from the sample mount will reach the entrance gap of the analyzer.

In the second part, or second lens, disposed between the deceleration path and the entrance gap of the energy analyzer, the aperture of the beam envelope is formed in the parallel beam path with simultaneous directing into the analyzer. Both lenses operate in the manner of a single lens which can be easily engineered. Thus, not only the vicinity of the sample but also the entrance gap of the energy analyzer can be kept free of interfering fields.

Advisably the second lens includes an asymmetrical aperture which corresponds to the angle of impingement and the entrance gap of the energy analyzer. This aperture prevents entrance of the above-mentioned high-energy particles into the analyzer.

The image reproduction properties of the two lenses are advisably selected so that the image plane of the first lens lies in the deceleration path and this image plane constitutes the object plane of the second lens, whose image plane lies in the entrance gap of the energy analyzer. This produces optimum reproduction properties. The deceleration in this mode of operation leads merely to a widening of the beam with a slight change in the second object plane without a change in the reproduction scale.

It is further advisable to limit the individual lenses, with respect to the deceleration path, by high-transmission grids. This prevents the fields of the individual lenses from being influenced by the field causing the deceleration of the particles.

A compact structure of the lens system can advantageously be obtained by providing, at least in the first lens, a further grid with high transmission. This reduces the spherical reproduction error by at least a factor 2. It is moreover advisable to make the lenses of nonmagnetic and noncorroding material in the form of tubular lenses with further grids disposed therein. The grids advantageously are made of molybdenum with niobium rings and have a transmission of higher than 95%.

Advantageously the point of transfer for the potentials of the respective lenses is selected to be at a distance from each grid of about ¼ the diameter of the grid. Thus electron beams with a large aperture, e.g. ±20°, can be utilized without losses for the electron-spectroscopy despite the resulting delay. ("The point of transfer for the potentials" is that place where the potential difference of one tubular lens is laid on the tubular lens.

Is is finally particularly advantageous for the vacuum apparatus in which the apparatus of the present invention is accommodated to be constituted in the area of the sample, by a spherical container with a plurality of flange connections. Further instruments, such as mass filters, an ion source, an electron source, an X-ray source, a UV source, preparation chambers, locks, pumps and the like, can be connected to these flange terminals for the simultaneous performance of further experiments or for a series of experiments to be performed without modification of the apparatus.

DESCRIPTION OF THE PREFERRED EMBODIMENTS

Figures 1, 2:
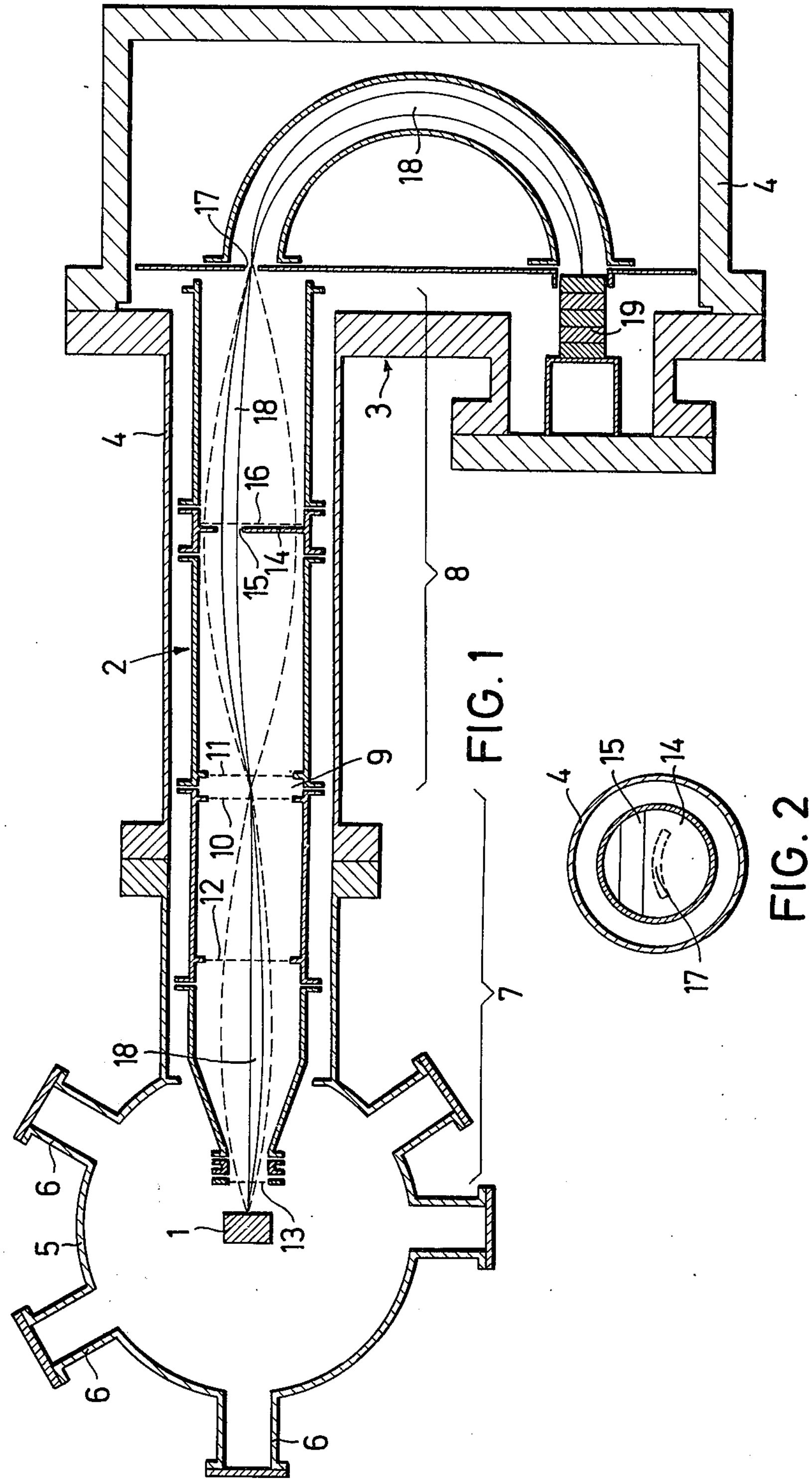
FIG. 1 is a cross-sectional view of a preferred embodiment of the invention.
FIG. 2 is a cross-sectional, axial end view looking into the second lens of the embodiment of FIG. 1, from the output end thereof.

FIG. 1 shows an embodiment of the apparatus according to the present invention which contains a sample 1, and which is composed of an electron-optical system 2 and a hemispherical energy analyzer 3. The elements 1, 2 and 3 are disposed inside a vacuum container generally indicated at 4 which includes in the region surrounding sample 1, a spherical container 5 provided with a plurality of flange terminals 6.

The electron-optical system 2 includes parts 7 and 8, each constructed to act as separate lens. Between these two individual lenses there is provided a region 9 defining a deceleration path. Lenses 7 and 8 are separated by grids 10 and 11, respectively, from the deceleration path region 9.

In order to produce an image without errors, a grid 12 is also provided in lens 7 at a distance from the potential transfer point of that lens which is approximately ¼ of the diameter of the grid. Lens 7 is also limited in the direction of sample 1 by a grid 13 so that the field of lens 7 is kept away from sample 1 and a lens with a short focal length is simultaneously produced. An aperture disc 14 with an asymmetrical gap 15 is accommodated in lens 8. A further grid 16 may be accommodated essentially in the plane of this aperture plate 14.

FIG. 2 is a sectional view through the lens system 2 at the level of aperture 14. The shape and lateral displacement of slit 15 in aperture 14 corresponds to the entrance gap 17 of the hemispherical energy analyzer 3. The entrance gap 17 is also shown in FIG. 2 in dashed lines. The grid 16 is not shown in this figure for the sake of clarity.

The beam envelope emanating from sample 1 and recorded by the illustrated spectrometer is marked 18. The lens 7 initially reproduces and enlarges the image. The image plane of lens 7 lies within the deceleration path 9 where the angle of the electron beam is merely widened according to the Lionville theorem. The virtual object plane of lens 8 also lies in the deceleration path 9. This lens directs the beam through an aperture and into the entrance gap 17 of the energy analyzer 3. Within the energy analyzer the beam 18 is deflected by 180° in a known manner and the energy content of the electrons is discriminated. Thereafter beam 18 is recorded in a secondary electron multiplier 19.

The deceleration path 9 is suited not only to provide deceleration but also to provide acceleration, to thus improve the intensity of the signals by larger spatial angles in the acceleration. This mode of operation is advisable if an increase in resolution is not required.

The figure shows an embodiment of the invention with reduced scale. The opening of the tube 4 is for example 100 mm.

It will be understood that the above description of the present invention is susceptible to various modifications, changes and adaptations and the same are intended to be comprehended within the meaning and range of equivalents of the appended clams.

I claim:

1. In a device for measuring the energy of charged particles separated from a sample by bombardment with ionizing radiation, which device includes an energy analyzer and an electron-optical system disposed between the sample location and the energy analyzer and containing means defining a deceleration path for the charged particles to be analyzed, the improvement wherein said electron-optical system comprises means defining two individual lenses between which an intermediate image is formed, and grids with high transmission disposed at the boundary between each said lens and said deceleration path, and wherein said deceleration path is disposed between said lenses at the location of such intermediate image, and said two lenses are constructed so that the image plane of the lens closer to the sample lies in the deceleration path, this image plane coincides with the object plane of the lens closer to the analyzer and the image plane of the lens closer to the analyzer lies in the entrance slit of the analyzer.

2. An arrangement as defined in claim 1 wherein that one of said lenses which is closer to the sample is an enlarging lens.

3. An arrangement as defined in claim 1 wherein that one of said lenses which is closer to the analyzer comprises means defining an asymmetrial aperture for controlling the cross section of the beam formed by the charged particles.

4. An arrangement as defined in claim 1, further comprising a vacuum container in which said analyzer, said electron-optical system and the sample are disposed, said container including a spherical container portion provided with a plurality of flange terminals and enclosing the location in which the sample is to be disposed.

5. Apparatus as defined in claim 1 wherein said lenses are constituted by nonmagnetic and noncorroding material, are in the form of tubular lenses, and each said lens comprises at least one further grid.

6. An arrangement as defined in claim 5 wherein each said grid is spaced from the potential transition point of its respective lens by a distance approximately equal to ¼ the diameter of said grid.

* * * * *